United States Patent
Chow et al.

(10) Patent No.: US 7,049,667 B2
(45) Date of Patent: May 23, 2006

(54) CONDUCTIVE CHANNEL PSEUDO BLOCK PROCESS AND CIRCUIT TO INHIBIT REVERSE ENGINEERING

(75) Inventors: Lap-Wai Chow, South Pasadena, CA (US); William M. Clark, Jr., Camarillo, CA (US); Gavin J. Harbison, Marina del Rey, CA (US); James P. Baukus, Westlake Village, CA (US)

(73) Assignees: HRL Laboratories, LLC, Malibu, CA (US); Raytheon Company, Lexington, MA (US)

( * ) Notice: Subject to any disclaimer, the term of this patent is extended or adjusted under 35 U.S.C. 154(b) by 0 days.

(21) Appl. No.: 10/635,790

(22) Filed: Aug. 5, 2003

(65) Prior Publication Data
US 2004/0061186 A1    Apr. 1, 2004

Related U.S. Application Data

(60) Provisional application No. 60/414,216, filed on Sep. 27, 2002.

(51) Int. Cl.
*H01L 29/76* (2006.01)

(52) U.S. Cl. ............... 257/399; 257/734; 257/773; 257/774; 257/368; 257/369

(58) Field of Classification Search ........... 257/382, 257/384, 607, 608, 609, 610, 611, 734, 773, 257/774
See application file for complete search history.

(56) References Cited

U.S. PATENT DOCUMENTS

| | | | |
|---|---|---|---|
| 3,673,471 A | 6/1972 | Klein et al. | 257/407 |
| 3,946,426 A | 3/1976 | Sanders | 357/71 |
| 4,017,888 A | 4/1977 | Christie et al. | 357/54 |
| 4,139,864 A | 2/1979 | Schulman | 358/188 |
| 4,164,461 A | 8/1979 | Schilling | 204/192 EC |
| 4,196,443 A | 4/1980 | Dingwall | 257/774 |
| 4,267,578 A | 5/1981 | Vetter | 364/709 |
| 4,291,391 A | 9/1981 | Chatterjee et al. | 365/184 |
| 4,295,897 A | 10/1981 | Tubbs et al. | 148/1.5 |
| 4,314,268 A | 2/1982 | Yoshioka et al. | 357/48 |
| 4,317,273 A | 3/1982 | Guterman et al. | 29/571 |
| 4,322,736 A | 3/1982 | Sasaki et al. | 257/369 |
| 4,374,454 A | 2/1983 | Jochems | 29/571 |
| 4,409,434 A | 10/1983 | Basset et al. | 380/265 |

(Continued)

FOREIGN PATENT DOCUMENTS

EP    0 364 769    4/1990

(Continued)

OTHER PUBLICATIONS

Blythe, et al., "Layout Reconstruction of Complex Silicon Chips," *IEEE Journal of Solid-State Circuits*, vol. 28, No. 2, pp. 138-145 (Feb. 1993).

(Continued)

*Primary Examiner*—Mai-Huong Tran
(74) *Attorney, Agent, or Firm*—Ladas & Parry LLP

(57) ABSTRACT

A technique for and structures for camouflaging an integrated circuit structure. The integrated circuit structure is formed by a plurality of layers of material having a controlled outline. A layer of conductive material having a controlled outline is disposed among said plurality of layers to provide artifact edges of the conductive material that resemble one type of transistor (operable vs. non-operable), when in fact another type of transistor was used.

5 Claims, 1 Drawing Sheet

U.S. PATENT DOCUMENTS

| | | | |
|---|---|---|---|
| 4,435,895 A | 3/1984 | Parrillo | 29/571 |
| 4,471,376 A | 9/1984 | Morcom et al. | 357/71 |
| 4,581,628 A | 4/1986 | Miyauchi et al. | 357/71 |
| 4,583,011 A | 4/1986 | Pechar | 307/440 |
| 4,603,381 A | 7/1986 | Guttag et al. | 364/200 |
| 4,623,255 A | 11/1986 | Suszko | 356/389 |
| 4,727,493 A | 2/1988 | Taylor, Sr. | 364/490 |
| 4,766,516 A | 8/1988 | Ozdemir et al. | 361/380 |
| 4,799,096 A | 1/1989 | Koeppe | 357/42 |
| 4,821,085 A | 4/1989 | Haken et al. | 357/67 |
| 4,830,974 A | 5/1989 | Chang et al. | 437/34 |
| 4,939,567 A | 7/1990 | Kenney | 257/383 |
| 4,962,484 A | 10/1990 | Takeshima et al. | 365/226 |
| 4,975,756 A | 12/1990 | Haken et al. | 357/4.1 |
| 4,998,151 A | 3/1991 | Korman et al. | 257/328 |
| 5,030,796 A | 7/1991 | Swanson et al. | 174/52.2 |
| 5,050,123 A | 9/1991 | Castro | 365/53 |
| 5,061,978 A | 10/1991 | Mizutani et al. | 357/30 |
| 5,065,208 A | 11/1991 | Shah et al. | 357/34 |
| 5,068,697 A | 11/1991 | Noda et al. | 357/23.5 |
| 5,070,378 A | 12/1991 | Yamagata | 357/23.5 |
| 5,101,121 A | 3/1992 | Sourgen | 307/465 |
| 5,117,276 A | 5/1992 | Thomas et al. | 357/71 |
| 5,121,089 A | 6/1992 | Larson et al. | 333/107 |
| 5,121,186 A | 6/1992 | Wong et al. | 257/384 |
| 5,132,571 A | 7/1992 | McCollum et al. | 307/465.1 |
| 5,138,197 A | 8/1992 | Kuwana | 307/449 |
| 5,146,117 A | 9/1992 | Larson | 307/465 |
| 5,168,340 A | 12/1992 | Nishimura | 357/376 |
| 5,177,589 A | 1/1993 | Kobayashi et al. | 257/773 |
| 5,202,591 A | 4/1993 | Walden | 307/450 |
| 5,225,699 A | 7/1993 | Nakamura | 257/306 |
| 5,227,649 A | 7/1993 | Chapman | 257/204 |
| 5,231,299 A | 7/1993 | Ning et al. | 257/316 |
| 5,302,539 A | 4/1994 | Haken et al. | 437/41 |
| 5,308,682 A | 5/1994 | Morikawa | 428/195 |
| 5,309,015 A | 5/1994 | Kuwata et al. | 257/659 |
| 5,317,197 A | 5/1994 | Roberts | 257/401 |
| 5,336,624 A | 8/1994 | Walden | 437/34 |
| 5,341,013 A | 8/1994 | Koyanagi et al. | 257/368 |
| 5,345,105 A | 9/1994 | Sun et al. | 257/659 |
| 5,354,704 A | 10/1994 | Yang et al. | 437/52 |
| 5,369,299 A | 11/1994 | Byrne et al. | 257/638 |
| 5,371,390 A | 12/1994 | Mohsen | 257/209 |
| 5,376,577 A | 12/1994 | Roberts et al. | 437/52 |
| 5,384,472 A | 1/1995 | Yin | 257/204 |
| 5,384,475 A | 1/1995 | Yahata | 257/314 |
| 5,399,441 A | 3/1995 | Bearinger et al. | 428/689 |
| 5,404,040 A | 4/1995 | Hshieh et al. | 257/341 |
| 5,412,237 A | 5/1995 | Komori et al. | 257/306 |
| 5,441,902 A | 8/1995 | Hsieh et al. | 437/34 |
| 5,468,990 A | 11/1995 | Daum | 257/632 |
| 5,475,251 A | 12/1995 | Kuo et al. | 257/316 |
| 5,506,806 A | 4/1996 | Fukushima | 365/195 |
| 5,531,018 A | 7/1996 | Saia et al. | 29/622 |
| 5,539,224 A | 7/1996 | Ema | 257/211 |
| 5,541,614 A | 7/1996 | Lam et al. | 343/792.5 |
| 5,571,735 A | 11/1996 | Mogami et al. | 437/41 |
| 5,576,988 A | 11/1996 | Kuo et al. | 365/185.04 |
| 5,611,940 A | 3/1997 | Zettler | 73/514.16 |
| 5,638,946 A | 6/1997 | Zavracky | 200/181 |
| 5,677,557 A | 10/1997 | Wuu et al. | 257/382 |
| 5,679,595 A | 10/1997 | Chen et al. | 437/52 |
| 5,719,422 A | 2/1998 | Burr et al. | 257/336 |
| 5,719,430 A | 2/1998 | Goto | 257/403 |
| 5,721,150 A | 2/1998 | Pasch | 437/46 |
| 5,783,375 A | 7/1998 | Twist | 430/414 |
| 5,783,846 A | 7/1998 | Baukus et al. | 257/204 |
| 5,821,590 A | 10/1998 | Lee et al. | 257/377 |
| 5,834,356 A | 11/1998 | Bothra et al. | 438/384 |
| 5,838,047 A | 11/1998 | Yamauchi et al. | 257/372 |
| 5,854,510 A | 12/1998 | Sur, Jr. et al. | 257/529 |
| 5,866,933 A | 2/1999 | Baukus et al. | 257/368 |
| 5,880,503 A | 3/1999 | Matsumoto et al. | 257/372 |
| 5,888,887 A | 3/1999 | Li et al. | 438/525 |
| 5,920,097 A | 7/1999 | Horne | 257/368 |
| 5,930,663 A | 7/1999 | Baukus et al. | 438/598 |
| 5,930,667 A | 7/1999 | Oda | 438/622 |
| 5,973,375 A | 10/1999 | Baukus et al. | 257/399 |
| 5,977,593 A | 11/1999 | Hara | 257/356 |
| 5,998,257 A | 12/1999 | Lane et al. | 438/253 |
| 6,037,627 A | 3/2000 | Kitamura et al. | 257/324 |
| 6,046,659 A | 4/2000 | Loo et al. | 333/262 |
| 6,054,659 A | 4/2000 | Lee et al. | 200/181 |
| 6,057,520 A | 5/2000 | Goodwin-Johansson | 200/181 |
| 6,064,110 A | 5/2000 | Baukus et al. | 257/652 |
| 6,093,609 A | 7/2000 | Chuang | 438/286 |
| 6,117,762 A * | 9/2000 | Baukus et al. | 438/618 |
| 6,137,318 A | 10/2000 | Takaaki | 326/112 |
| 6,154,388 A | 11/2000 | Oh | 365/185.04 |
| 6,215,158 B1 | 4/2001 | Choi | 257/368 |
| 6,294,816 B1 | 9/2001 | Baukus et al. | 257/368 |
| 6,326,675 B1 * | 12/2001 | Scott et al. | 257/608 |
| 6,365,453 B1 | 4/2002 | Deboer et al. | 438/253 |
| 6,410,413 B1 * | 6/2002 | Scott et al. | 438/601 |
| 6,815,816 B1 * | 11/2004 | Clark et al. | 257/734 |

FOREIGN PATENT DOCUMENTS

| | | |
|---|---|---|
| EP | 0 463 373 | 1/1992 |
| EP | 0 528 302 A1 | 2/1993 |
| EP | 0 585 601 A1 | 3/1994 |
| EP | 0 764 985 A2 | 3/1997 |
| EP | 0 883 184 A2 | 12/1998 |
| JP | 58-190064 | 11/1983 |
| JP | 63-129647 A | 6/1988 |
| JP | 02-046762 | 2/1990 |
| JP | 02-237038 | 9/1990 |
| WO | 98/21734 | 5/1998 |
| WO | 00/44012 | 7/2000 |

OTHER PUBLICATIONS

Frederiksen, Thomas M., "Standard Circuits in the New CMOS Era," *Intuitive CMOS Electronics*, Revised Edition, pp. 134-146 (Jan. 1989).

Hodges and Jackson, *Analysis and Design of Digital Integrated Circuits*, 2nd edition, McGraw-Hill, p. 353 (1988).

Larson, L.E., et al., "Microactuators for GaAs-based Microwave Integrated Circuits," *IEEE*, pp. 743-746 (1991).

Lee, "Engineering a Device for Electron-Beam Probing," *IEEE Design and Test of Computers*, pp. 36-49 (Jun. 1989).

Ng, K.K., *Complete Guide to Semiconductor Devices*, McGraw-Hill, Inc., pp. 164-165 (1995).

Sze, S.M., *VLSI Technology*, McGraw-Hill, pp. 99, 447, 461-465 (1983).

Sze, S.M., ed., "Silicides for Gates and Interconnections," *VLSI Technology*, McGraw-Hill, pp. 372-380 (1983).

U.S. Appl. No. 09/391,258, filed Sep. 7, 1999, Baukus et al.

U.S. Appl. No. 10/637,848, filed Aug. 7, 2003, Chow et al.

* cited by examiner

CONDUCTIVE CHANNEL PSEUDO BLOCK PROCESS AND CIRCUIT TO INHIBIT REVERSE ENGINEERING

CROSS REFERENCE TO A RELATED APPLICATION

This application claims the benefit of U.S. Provisional Application No. 60/414,216, filed Sep. 27, 2002, the disclosure of which is incorporated herein by reference.

TECHNICAL FIELD

The present invention relates to integrated circuits (ICs) and semiconductor devices in general and their methods of manufacture wherein the integrated circuits and semiconductor devices employ camouflaging techniques which make it difficult for the reverse engineer to discern how the semiconductor device functions.

RELATED ART

The present invention is related to the following US patents by some of the same inventors as the present inventors:

(1) U.S. Pat. Nos. 5,866,933; 5,783,375 and 6,294,816 teach how transistors in a CMOS circuit are connected by implanted (and therefore hidden and buried) lines between the transistors by modifying the p+ and n+ source/drain masks. These implanted interconnections are used to make 3-input AND or OR circuits look substantially identical to the reverse engineer. Also, buried interconnects force the reverse engineer to examine the IC in greater depth to try to figure out the connectivity between transistors and hence their function.

(2) U.S. Pat. Nos. 5,783,846; 5,930,663 and 6,064,110 teach a further modification in the source/drain implant masks so that the implanted connecting lines between transistors have a gap inserted, with approximately the length of the minimum feature size of the CMOS technology being used. If this gap is "filled" with one kind of implant, the line conducts; but if it is "filled" with another kind of implant, the line does not conduct. The intentional gaps are called "channel blocks." The reverse engineer is forced to determine connectivity on the basis of resolving the implant type at the minimum feature size of the CMOS process being used.

(3) U.S. Pat. No. 6,117,762 teaches a method and apparatus for protecting semiconductor integrated circuits from reverse engineering. Semiconductor active areas are formed on a substrate and a silicide layer is formed both over at least one active area of the semiconductor active areas and over a selected substrate area for interconnecting the at least one active area with another area through the silicide area formed on the selected substrate area.

BACKGROUND OF THE INVENTION

The creation of complex integrated circuits and semiconductor devices can be a very expensive undertaking given the large number of hours of sophisticated engineering talent involved in designing such devices. Additionally, integrated circuits can include read only memories and/or EEPROMS into which software, in the form of firmware, is encoded. Further, integrated circuits are often used in applications involving the encryption of information, therefore, in order to keep such information confidential, it can be desirable to keep such devices from being reverse engineered. Thus, there can be a variety of reasons for protecting integrated circuits and other semiconductor devices from being reversed engineered.

In order to keep the reverse engineer at bay, different techniques are known in the art to make integrated circuits more difficult to reverse engineer. One technique is to make the connections between transistors difficult to determine forcing the reverse engineer to carefully analyze each transistor (in particular, each CMOS transistor pair for CMOS devices), and thwarting attempts to use automatic circuit and pattern recognition techniques in order to reverse engineer an integrated circuit. Since integrated circuits can have hundreds of thousands or even millions of transistors, forcing the reverse engineer to carefully analyze each transistor in a device can effectively frustrate the reverse engineer's ability to reverse engineer the device successfully.

A conductive layer, such as silicide, is often used during the manufacturing of semiconductor devices. In modern CMOS devices, especially with feature sizes below 0.5 μm, a silicide layer is utilized to improve the conductivity of gate, source and drain contacts. In accordance with general design rules, any implant region using a source/drain implant is silicided.

One common reverse engineering technique involves de-layering the completed IC by means of chemical mechanical polishing (CMP). The CMP process may, under some conditions, reveal the regions between where the silicide was formed and where it was not, i.e., the regions defined by the silicide block mask step. These regions may be revealed because, under some kinds of chemical etches, there is an observable difference in topology due to different etching rates for silicided areas versus pure silicon areas. The reverse engineer, by noting the silicided areas versus non-silicided areas, may make reasonable assumptions as to the function of the device. This information can then be stored into a database for automatic classification of other similar devices.

Some methods of protecting against reverse engineering may be susceptible to discovery under some reverse engineering techniques, such as CMP. For example, FIGS. 1A and 1B depict artifacts after CMP processing of transistors made in accordance with U.S. Pat. Nos. 5,783,846; 5,930,663; and 6,064,110. U.S. Pat. Nos. 5,783,846; 5,930,663; and 6,064,110 disclose hiding the connection of doped circuit elements 26, 22 (i.e. source/drain areas) of like conductivity with electrically conductive doped implants 23–25 in the substrate, as shown in FIG. 1A. The electrically conductive doped implants 23–25 in the substrate may be provided during the same processing step as the source/drain regions and, as such, have the same doping levels and are similarly silicided. In addition, as shown in FIG. 1B, to further confuse the reverse engineer, an electrically conductive doped implant is selectively doped with a different conductivity type, creating a channel block structure 27, which prevents the electrical connection from one doped circuit element to another. In order to prevent the electrical connection from one doped circuit element 26 to another 22 via the silicide, the silicide block mask is modified. Instead of allowing a silicide layer to occur over any implant region using a source/drain implant, the silicide block mask is modified to prevent a silicide layer over the channel block structure 27.

FIGS. 1A and 1B depict artifact edges 28 of the silicide by the broken lines shown thereon. In FIG. 1A, the silicide is allowed to cover the all of the doped regions 22–26 because all of the doped regions 22–26 are doped with like conductivity type dopants. In FIG. 1B, a silicide block mask is used to prevent silicide from covering doped region 27. A reverse engineer, after a suitable stain/etch on the bare silicon surface, may be able to view this area and detect the artifact edges 28 of the silicide, which are produced at the interfaces of the silicided versus non-silicided regions. For the structure depicted by FIG. 1B, the reverse engineer could possibly conclude that when the artifact edge 28 is as shown, with an interruption 30 between the two depicted silicided portions, that such an interruption 30 would denote that the underlying conductive implants include a non-conductive channel block structure 27. This information could then be entered into a data base and automatic pattern recognition techniques could be used to recognize the pattern with the interruption 30 as being indicative of a non-conductive channel block structure 27. Thus, the effectiveness of this circuit camouflage technique is diminished.

Therefore a need exists to provide a semiconductor device and a method of manufacturing semiconductor devices that uses artifact edges to confuse the reverse engineer. Providing artifact edges that are not indicative of the actual device formed will further confuse the reverse engineer and result in incorrect conclusions as to the actual composition, and thus function, of the device.

SUMMARY OF THE INVENTION

It is an object of this invention to make reverse engineering even more difficult and, in particular, to confuse the reverse engineer's study of the artifacts revealed during the reverse engineering process by providing artifacts that are not indicative of the same underlying processing and circuit features so that the reverse engineer is given reason to doubt the validity of typical conclusions. It is believed that this will make the reverse engineer's efforts all the more difficult in terms of making it very time consuming in order to reverse engineer a chip employing the present invention and perhaps making it exceedingly impractical, if not impossible, to reverse engineer a chip employing the present invention. By confusing the reverse engineer's study of the artifacts, the reverse engineer is forced to examine every implanted channel making the reverse engineer's job extremely time consuming.

An important aspect of the present invention is that it does not rely upon modifications or additions to the function of the circuitry that is to be protected from reverse engineering, nor does it require any additional processing steps or equipment. Instead, a highly effective deterrent to reverse engineering is accomplished in a streamlined manner that adds neither processing time nor complexity to the basic circuitry.

The inventors named herein have previously filed patent applications and have received Patents in this general area of technology, that is, relating to the camouflage of integrated circuit devices in order to make it more difficult to reverse engineer them. The present invention can be used harmoniously with the techniques disclosed above in the prior United States Patents to further confuse the reverse engineer.

Note that the present invention might only be used on one in a thousand instances on the chip in question, but the reverse engineer will have to look very carefully at each transistor or connection knowing full well that for each transistor or connection that he or she sees, there is a very low likelihood that it has been modified by the present invention. The reverse engineer will be faced with having to find the proverbial needle in a haystack. The present invention may also be used numerous times, i.e. with every CMOS pair, thus the reverse engineer is forced to study each channel, thereby making reverse engineering very impractical.

Briefly, and in general terms, the present invention comprises a semiconductor device and a method of manufacturing a semiconductor device in which a conductive layer block mask is modified resulting in reverse engineering artifacts that are misleading and not indicative of the true structure of the device.

In another aspect, the present invention provides for camouflaging an integrated circuit structure. The integrated circuit structure is formed by a plurality of layers of material having controlled outlines. A layer of silicide is disposed among said plurality of layers with a controlled outline. The layer of silicide being used to confuse the reverse engineer into believing the semiconductor has one structure, when in fact it has another structure.

DETAILED DESCRIPTION

Figure 1A:
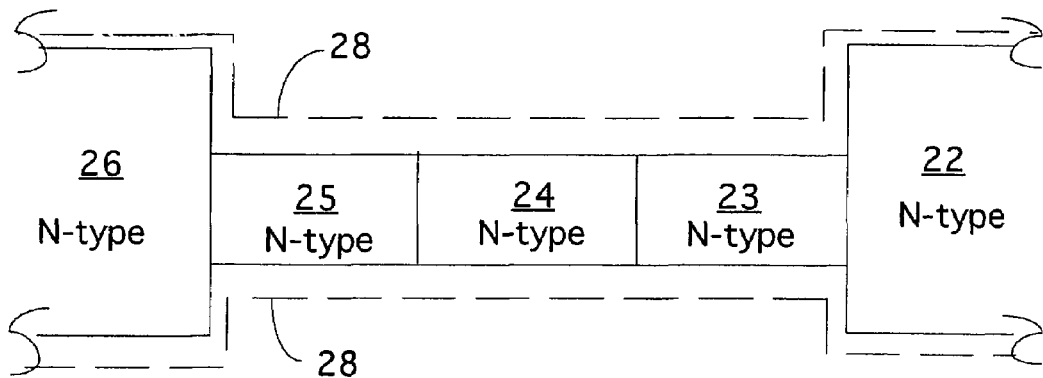
FIG. 1A depicts prior art artifact edges of a silicide layer the reverse engineer will see after all the metal and oxide layers have been removed from a conductive channel.

The present invention now will be described more fully hereinafter with reference to the accompanying drawings, in which a preferred embodiment of the invention is shown. This invention may be embodied in many different forms and should not be construed as limited to the embodiments set forth herein.

There are many methods of manufacturing of semiconductor devices well-known in the art. The following discussion does not include details regarding the manufacturing of semiconductor devices. Rather, the discussion focuses on modifying a conductive layer block mask used during the manufacturing of semiconductor devices in order to further confuse a reverse engineer.

The present invention makes use of an artifact edge of a silicide layer that a reverse engineer might see when reverse engineering devices manufactured with other reverse engineering detection prevention techniques.

In a reverse engineering detection prevention technique, described above, channel block structures are used to confuse the reverse engineer. As shown in FIG. 1B, the channel block structure 27 has a different dopant type than the channel areas 23, 25 and has an interruption 30 in the overlying silicide. After using a reverse engineering process, such as CMP, the artifact edges 28 of a silicide layer may reveal to the reverse engineer that a channel block structure 24, 27 has been used to interrupt the electrical connection between two channel areas 23, 25, as can be seen from comparing FIGS. 1A and 1B. The type of dopant used in the channel areas and the channel block structure is not readily available to the reverse engineer during most reverse engineering processes. Thus, the reverse engineer is forced to rely upon other methods, such as the artifact edges 28 of a silicide layer, to determine if the conductive channel has a channel block in it.

Figure 1B:
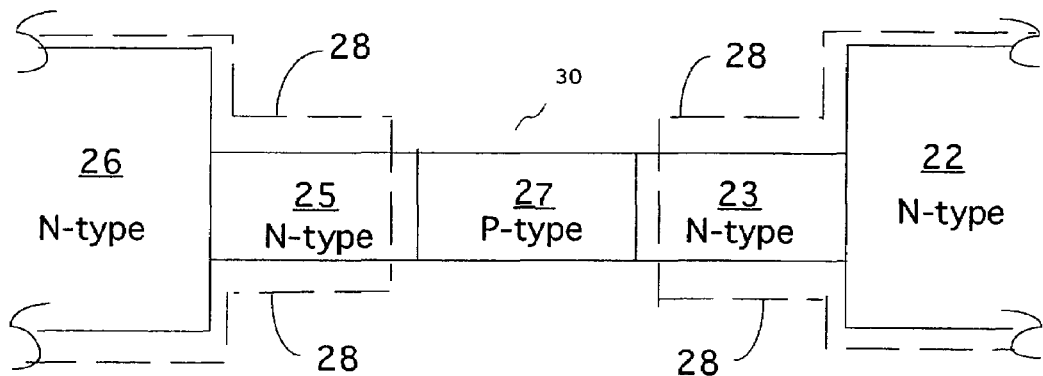
FIG. 1B depicts prior art artifact edges of a silicide layer the reverse engineer will see after all the metal and oxide layers have been removed from a conductive channel which includes a channel block.
Figure 2:
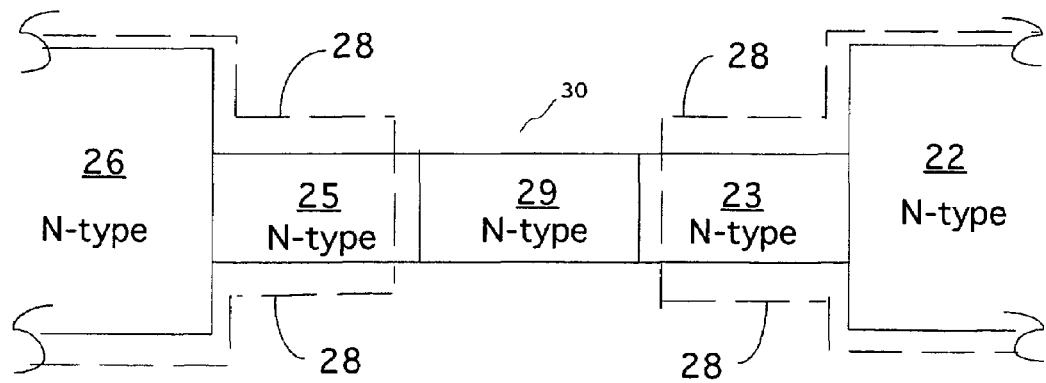
FIG. 2 depicts artifact edges of a silicide layer the reverse engineer will see after all the metal and oxide layers have been removed in accordance with one embodiment of the present invention.

FIG. 2 depicts artifact edges 28 of a silicide layer of a device manufactured in accordance with the present invention. A silicide block mask is preferably modified to prevent a silicide layer from completely covering a pseudo channel block structure 29. Channel block structure 29 is of the same conductivity type as channel areas 23, 25; therefore, the presence or absence of a silicide layer connecting the channel areas 23, 25 does not have an impact on the electrical conductivity through the channel. However, by modifying the silicide block mask to prevent a silicide layer from completely covering the pseudo channel block structure 29, the artifact edge 28 with interruption 30 appears to the reverse engineer to indicate that the channel is not electrically connected, i.e. the artifact edges 28 of FIG. 2 are identical to the artifact edges 28 of FIG. 1B. Thus, the reverse engineer, when viewing the artifact edge 28, would leap to an incorrect assumption as to the connectivity of the underlying channel.

In order to further camouflage the circuit, the dopant type used in channel block structure 29 may be created at the same time Lightly Doped Drains (LDD) are created. Thus, even using stain and etch processes, the reverse engineer will have a much more difficult time discerning the difference between the two types of implants, N-type versus P-type, vis-a-vis the much higher dose of the source/drain implants 22, 26. Further, by creating the pseudo channel block structure 29 with the LDD processes, the channel block structure 29 can be made smaller in dimensions because of breakdown considerations.

In the preferred method of manufacturing the present invention, the design rules of a semiconductor chip manufacturer are modified to allow implanted regions that are not silicided. In addition, the design rules may also be modified to allow for channel block structure 29 to be small and lightly doped (through the use of LDD implants) to further prevent detection by the reverse engineer.

In modifying the design rules, it is important to ensure that the artifact edges of an actual conducting channel, as shown in FIG. 2, match the placement of the artifact edges of a non-conducting channel, as shown in FIG. 1B. For illustration purposes, the artifact edges 28 in FIG. 1B match the artifact edges 28 of FIG. 2. As one skilled in the art will appreciate, the artifact edges 28 do not have to be located as specifically shown in FIG. 1B or 2. Instead, the artifact edges may appear almost anywhere along the channel. However, it is important that (1) the silicide layer does not provide an electrical connection (i.e. that the silicide layer does not completely cover channels with an intentional block or a pseudo block therein), and (2) that the artifact edges 28 for an electrical connection (i.e. a true connection) are relatively the same as the artifact edges 28 for a non-electrical connection (i.e. a false connection). As such, while it may be advisable to include conducting and non-conducting channels of the types shown in FIGS. 1A, 1B and 2 all on a single integrated circuit device, it is the use of a mixture of channels of the types shown and described with reference to FIGS. 1B and 2 that will keep the reverse engineer at bay.

One skilled in the art will appreciate that while FIGS. 1A, 1B and 2 use N-type doped areas 22–25, 29 with a P-type channel block structure 27 the above holds true for P-type doped areas with a N-type channel block structure.

Additionally, the invention is preferably used not to completely disable a multiple transistor circuit in which this invention is used, but rather to cause the circuit to function in an unexpected or non-intuitive manner. For example, what appears to be an OR gate to the reverse might really function as an AND gate. Or what appears as an inverting input might really be non-inverting. The possibilities are practically endless and are almost sure to cause the reverse engineer so much grief that he or she will give up as opposed to pressing forward to discover how to reverse engineer the integrated circuit device on which these techniques are utilized.

Finally, the disclosed method and apparatus is compatible with other camouflaging techniques which may be used to protect integrated circuit devices from being reverse engineered. Thus, this may be one of many techniques used with a given integrated circuit device to protect it from being successfully reverse engineered.

Having described the invention in connection with certain preferred embodiments thereof, modification will now certainly suggest itself to those skilled in the art. As such, the invention is not to be limited to the disclosed embodiments, except as is specifically required by the appended claims.

What is claimed is:

1. A semiconductor connection comprising:
   at least two active areas;
   an electrically conductive doped channel providing an electrical connection between said at least two active areas;
   a first conductive layer disposed over a first portion of said electrically conductive channel; and
   a second conductive layer disposed over a second portion of said electrically conductive channel wherein said first and second conductive layers are spaced apart from one another and a third portion of the electrically conductive doped channel between said first conductive layer and said second conductive layer is uncovered.

2. The semiconductor connection of claim 1 wherein said first and second conductive layers are silicide layers.

3. The semiconductor connection of claim 1 wherein said electrically conductive doped channel comprises:
   a first doped channel area adjacent to a first one of said at least two active areas;
   a second doped channel area adjacent to a second one of said at least two active areas; and
   a channel block structure disposed in between said first doped channel area and said second doped channel area.

4. The semiconductor connection of claim 3 wherein said first doped channel area, said second doped channel area, and said channel block structure have a same conductivity type.

5. The semiconductor connection of claim 3 wherein said at least two active areas have a first doping concentration and said channel block structure has a second doping concentration, said second doping concentration being less than said first doping concentration.

* * * * *